(12) United States Patent
Dijksman et al.

(10) Patent No.: US 8,486,485 B2
(45) Date of Patent: Jul. 16, 2013

(54) METHOD OF DISPENSING IMPRINTABLE MEDIUM

(75) Inventors: Johan Frederik Dijksman, Weert (NL); Anke Pierik, Eindhoven (NL); Martin Maurice Vernhout, Geldrop (NL); Sander Frederik Wuister, Eindhoven (NL); Yvonne Wendela Kruijt-Stegeman, Eindhoven (NL); Ivar Schram, Weert (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/194,630

(22) Filed: Jul. 29, 2011

(65) Prior Publication Data

US 2012/0012611 A1    Jan. 19, 2012

Related U.S. Application Data

(63) Continuation of application No. 11/478,304, filed on Jun. 30, 2006, now Pat. No. 8,015,939.

(51) Int. Cl.
*B05D 5/12* (2006.01)
*C23C 16/52* (2006.01)

(52) U.S. Cl.
USPC ............. 427/8; 427/9; 427/10; 427/282

(58) Field of Classification Search
USPC ............................ 427/8–10, 282
See application file for complete search history.

(56) References Cited

U.S. PATENT DOCUMENTS

| | | | |
|---|---|---|---|
| 4,595,935 A * | 6/1986 | Brooks et al. | 347/171 |
| 5,455,606 A * | 10/1995 | Keeling et al. | 347/7 |
| 5,512,131 A | 4/1996 | Kumar et al. | |
| 5,772,905 A | 6/1998 | Chou | |
| 5,940,101 A | 8/1999 | Mutoh | |
| 6,165,911 A | 12/2000 | Calveley | |
| 6,257,694 B1 | 7/2001 | Tokumaru et al. | |
| 6,309,580 B1 | 10/2001 | Chou | |
| 6,334,960 B1 | 1/2002 | Willson et al. | |
| 6,365,059 B1 | 4/2002 | Pechenik | |
| 6,375,870 B1 | 4/2002 | Visovsky et al. | |

(Continued)

FOREIGN PATENT DOCUMENTS

| | | |
|---|---|---|
| JP | 01-150549 A | 6/1989 |
| JP | 10-114394 A | 5/1998 |

(Continued)

OTHER PUBLICATIONS

Stephen Y. Chou, et al., "Nanoimprint Lithography", J. Vac. Sci. Technol. B14(6), Nov./Dec. 1996, pp. 4129-4133.

(Continued)

*Primary Examiner* — Brian K Talbot
(74) *Attorney, Agent, or Firm* — Pillsbury Winthrop Shaw Pittman LLP

(57) ABSTRACT

An imprintable medium dispenser includes a chamber, a nozzle, and an actuator connected to the chamber and configured to be actuated and thereby generate a pressure wave within the chamber such that imprintable medium is dispensed from the nozzle. The imprintable medium dispenser is provided with a control circuit which includes a monitoring apparatus configured to receive a transient oscillation signal generated when the actuator is actuated, and to monitor the operation of the imprintable medium dispenser by monitoring the transient oscillation signal.

20 Claims, 8 Drawing Sheets

U.S. PATENT DOCUMENTS

| | | |
|---|---|---|
| 6,482,742 B1 | 11/2002 | Chou |
| 6,518,189 B1 | 2/2003 | Chou |
| 6,521,187 B1 | 2/2003 | Papen |
| 6,646,662 B1 | 11/2003 | Nebashi et al. |
| 6,656,341 B2 | 12/2003 | Petersson et al. |
| 6,696,220 B2 | 2/2004 | Bailey et al. |
| 6,719,915 B2 | 4/2004 | Willson et al. |
| 6,921,615 B2 | 7/2005 | Sreenivasan et al. |
| 7,360,851 B1 | 4/2008 | Snyder |
| 7,413,710 B2 | 8/2008 | Lisec et al. |
| 8,015,939 B2 * | 9/2011 | Dijksman et al. ............. 118/300 |
| 2002/0093122 A1 | 7/2002 | Choi et al. |
| 2002/0094496 A1 | 7/2002 | Choi et al. |
| 2002/0132482 A1 | 9/2002 | Chou |
| 2002/0167117 A1 | 11/2002 | Chou |
| 2002/0177319 A1 | 11/2002 | Chou |
| 2003/0034329 A1 | 2/2003 | Chou |
| 2003/0080471 A1 | 5/2003 | Chou |
| 2003/0080472 A1 | 5/2003 | Chou |
| 2003/0081193 A1 | 5/2003 | White et al. |
| 2003/0127580 A1 | 7/2003 | Ling et al. |
| 2003/0139042 A1 | 7/2003 | Heidari |
| 2003/0141291 A1 | 7/2003 | Heidari et al. |
| 2003/0159608 A1 | 8/2003 | Heidari |
| 2003/0170053 A1 | 9/2003 | Montelius et al. |
| 2003/0189273 A1 | 10/2003 | Olsson |
| 2004/0005444 A1 | 1/2004 | Heidari |
| 2004/0009673 A1 | 1/2004 | Sreenivasan et al. |
| 2004/0021866 A1 | 2/2004 | Watts et al. |
| 2004/0022888 A1 | 2/2004 | Sreenivasan et al. |
| 2004/0036201 A1 | 2/2004 | Chou et al. |
| 2004/0046288 A1 | 3/2004 | Chou |
| 2004/0081798 A1 | 4/2004 | Lee et al. |
| 2004/0124566 A1 | 7/2004 | Sreenivasan et al. |
| 2004/0149367 A1 | 8/2004 | Olsson et al. |
| 2004/0169003 A1 | 9/2004 | Lee et al. |
| 2004/0192041 A1 | 9/2004 | Jeong et al. |
| 2004/0200411 A1 | 10/2004 | Willson et al. |
| 2004/0209470 A1 | 10/2004 | Bajorek |
| 2004/0219249 A1 | 11/2004 | Chung et al. |
| 2004/0219461 A1 | 11/2004 | Chung et al. |
| 2004/0255641 A1 | 12/2004 | Preckel et al. |
| 2005/0039618 A1 | 2/2005 | Heidari et al. |
| 2005/0064054 A1 | 3/2005 | Kasumi |
| 2005/0116977 A1 * | 6/2005 | Shinkawa et al. ............... 347/14 |
| 2005/0270312 A1 | 12/2005 | Lad et al. |
| 2006/0071960 A1 * | 4/2006 | Mataki ............................ 347/10 |
| 2008/0003827 A1 | 1/2008 | Dijksman et al. |

FOREIGN PATENT DOCUMENTS

| | | |
|---|---|---|
| JP | 11-334102 A | 12/1999 |
| JP | 2004-512520 T | 4/2004 |
| JP | 2005-207898 A | 8/2005 |
| WO | 01/79591 A1 | 10/2001 |
| WO | 01/79592 A1 | 10/2001 |
| WO | 02/35187 A1 | 5/2002 |
| WO | 2006/067704 A1 | 6/2006 |

OTHER PUBLICATIONS

Jan Haisma, et al., "Mold-assisted nanolithography: A process for reliable pattern replication", J. Vac. Sci. Technol. B 14(6), Nov./Dec. 1996, pp. 4124-4128.

Office Action dated Jul. 14, 2010 issued in Japanese Application No. 2007-164953.

* cited by examiner

Figure 6
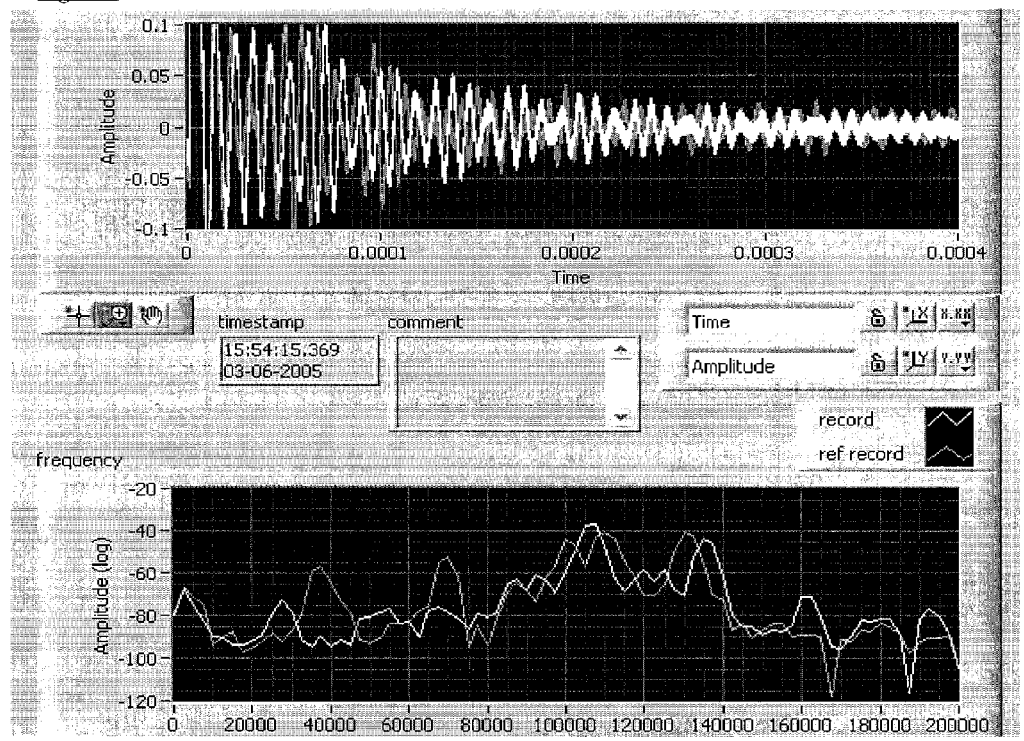
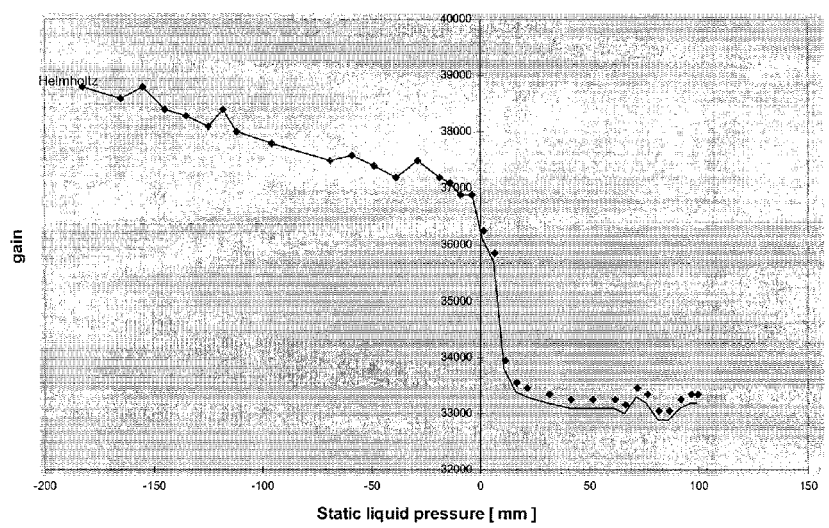
Figure 7

METHOD OF DISPENSING IMPRINTABLE MEDIUM

This application is a continuation application of U.S. patent application Ser. No. 11/478,304, filed Jun. 30, 2006 now U.S. Pat. No. 8,015,939, now allowed, the foregoing application incorporated herein in its entirety by reference.

FIELD

The present invention relates to an imprintable medium dispenser, and associated method, for use in imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays, ultra-high density hard disks, photonic crystals and other devices involving fine structures.

It is desirable to reduce the size of features in a lithographic pattern because this allows for a greater density of features on a given substrate area. In photolithography, the increased resolution may be achieved by using light of shorter wavelength. However, there are problems associated with such reductions. Current systems are starting to adopt optical sources with wavelengths in the 193 nm regime but even at this level, diffraction limitations become a barrier. At lower wavelengths e.g. extreme ultra violet in the 13.5 nm regime, the transparency of materials is very poor. Optical lithography machines capable of enhanced resolutions require complex optics and rare materials and are consequently very expensive.

An alternative for printing sub-100 nm features, known as imprint lithography, comprises transferring a pattern to a substrate by imprinting a pattern into an imprintable medium using a physical mould or template. The imprintable medium may be the substrate or a material coated on to a surface of the substrate. The imprintable medium may be functional or may be used as a "mask" to transfer a pattern to an underlying surface. The imprintable medium may for instance be provided as a resist deposited on a substrate such as a semiconductor material to which the pattern defined by the template is to be transferred. Imprint lithography is thus essentially a moulding process on a micrometer or nanometer scale in which the topography of a template defines the patterns created on a substrate. Patterns may be layered as with optical lithography processes so that in principle imprint lithography could be used for such applications as IC manufacture.

The resolution of imprint lithography is limited only by the resolution of the template fabrication process for instance, imprint lithography has been used to produce features in the sub-50 nm range with significantly improved resolution and line edge roughness compared to that achievable with conventional optical lithography processes. In addition, imprint processes do not require expensive optics, advanced illumination sources or specialised resist materials typically required by optical lithography processes.

Current imprint lithography processes do have a number of drawbacks, particularly with regard to achieving overlay accuracy and high throughput. However the significant improvements in resolution and line edge roughness attainable from imprint lithography are strong drivers for addressing these and other problems.

The accurate delivery of imprintable medium to the substrate prior to imprinting is an important embodiment of imprint lithography. It is an object of the invention to provide a novel and inventive apparatus and method imprintable medium dispenser which allows the delivery of imprintable medium to be monitored.

SUMMARY

According to a first embodiment of the present invention there is provided an imprintable medium dispenser comprising a chamber, a nozzle, and an actuator connected to the chamber and configured to be actuated and thereby generate a pressure wave within the chamber such that imprintable medium is dispensed from the nozzle, wherein the imprintable medium dispenser is provided with a control circuit which includes a monitoring apparatus configured to receive a transient oscillation signal generated when the actuator is actuated, and to monitor the operation of the imprintable medium dispenser by monitoring the transient oscillation signal.

According to a second embodiment of the invention there is provided a method of dispensing imprintable medium from a dispenser comprising a chamber, a nozzle, and an actuator connected to the chamber, the method comprising actuating the actuator such that it generates a pressure wave within the chamber which causes imprintable medium to be dispensed from the nozzle, the method further comprising monitoring operation of the dispenser by monitoring a transient oscillation signal generated when the actuator is actuated.

Further features of one or more embodiments of the present invention will be apparent from the following description.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 6 shows frequency and time domain transient oscillation data detected during operation of the embodiment(s) of the invention;

FIG. 7 shows a graphical representation of Helmholtz frequency data of the transient oscillations detected during operation of the embodiment(s) of the invention.

DETAILED DESCRIPTION

There are two principal approaches to imprint lithography which will be termed generally as hot imprint lithography and UV imprint lithography. There is also a third type of imprint lithography which may be referred to as "printing" lithography. Examples of these are illustrated in FIGS. 1a to 1c.

Figure 1A:
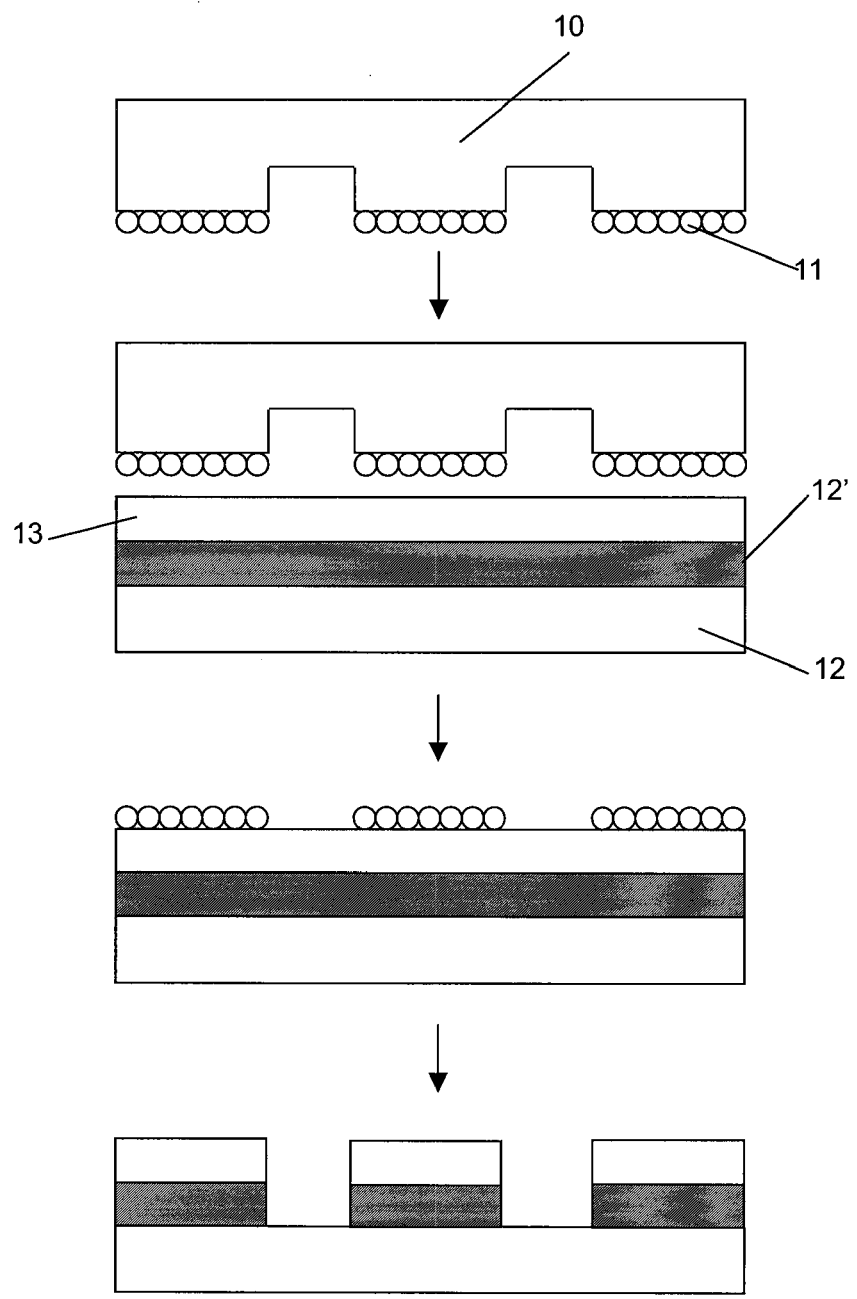
FIG. 1a illustrates an example of a conventional 'printing' lithography process for applying a pattern onto a target portion of a substrate.
Figure 1B:
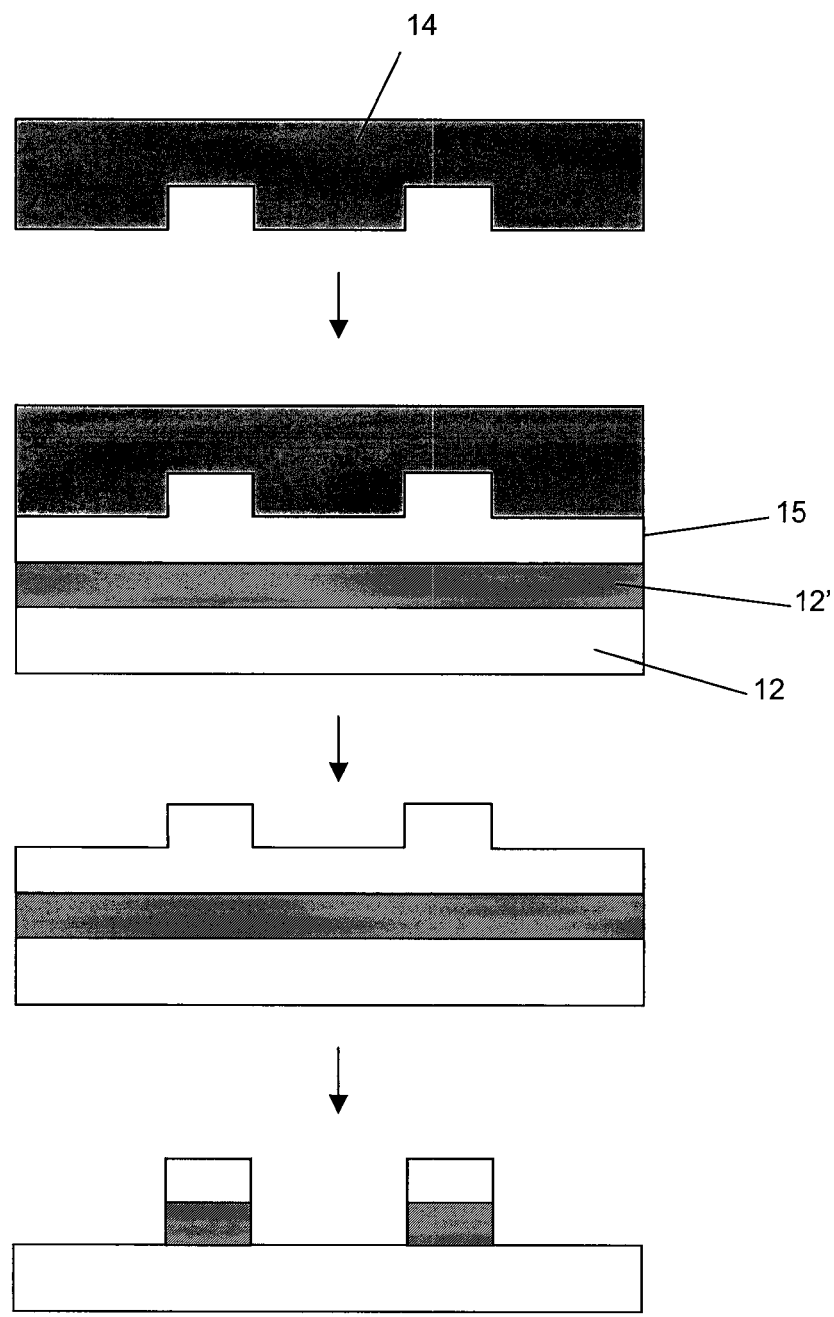
FIG. 1b illustrates an example of a hot imprint lithography process for applying a pattern onto a target portion of a substrate.
Figure 1C:
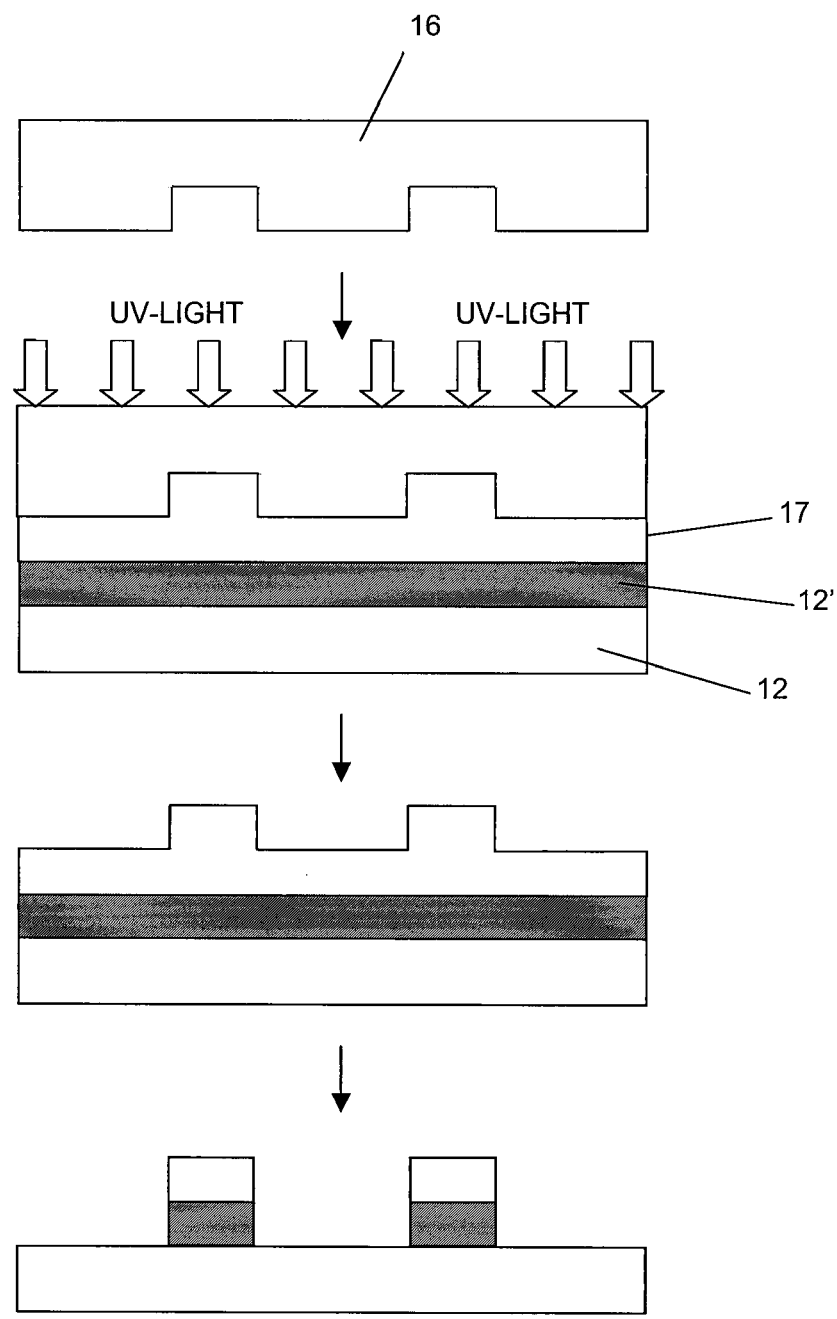
FIG. 1c illustrates an example of a UV lithography process for applying a pattern onto a target portion of a substrate.

FIG. 1a shows a printing lithography process, known as micro-contact printing, which involves transferring a layer of molecules 11 (typically an ink such as a thiol) from a flexible template 10 (typically fabricated from polydimethylsiloxane (PDMS) onto a resist layer 13 which is supported upon a substrate 12 and planarisation and transfer layer 12'. The template 10 has a pattern of features on its surface, the molecular layer being disposed upon the features. When the template is pressed against the resist layer the layer of molecules 11 stick to the resist. Upon removal of the template from the resist the layer of molecules 11 stick to the resist, the residual layer of resist is etched such that the areas of the resist not covered by the transferred molecular layer are etched down to the substrate.

Printing lithography is an example of soft imprint lithography. The term 'soft imprint lithography' is generally used to mean imprint lithography in which the imprint template is elastically deformable.

The template used in printing lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses harder templates made from, for example, silicon or nickel, which are more resistant to wear and deformation. This is described for instance in U.S. Pat. No. 6,482,742 and illustrated in FIG. 1b. In a typical hot imprint process a solid template 14 is imprinted into a thermosetting or a thermoplastic polymer resin 15, which has been cast on the surface of a substrate 12. The resin may for instance be spin coated and baked onto the substrate surface or more typically (as in the example illustrated) onto a planarisation and transfer layer 12'. It shall be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resins to temperatures considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will include the features in relief from a residual layer of the resin which may then be removed by an appropriate etch process to leave only the pattern features.

Figure 2:
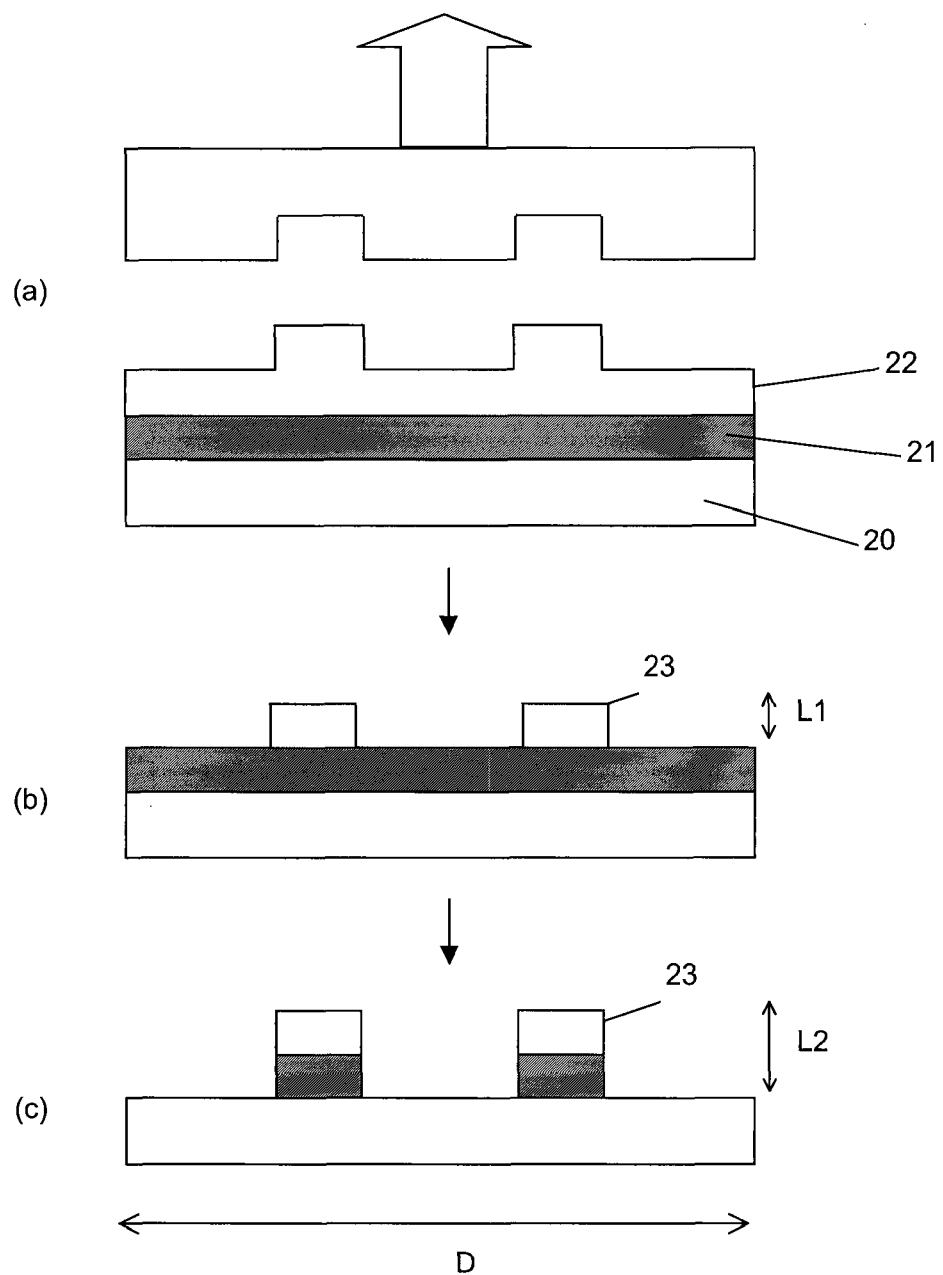
FIG. 2 illustrates a two step etching process employed when hot and UV imprint lithography is used to pattern a resist layer.

Upon removal of the template from the solidified resin, a two-step etching process is performed as illustrated in FIGS. 2a to 2c. The substrate 20 has a planarisation and transfer layer 21 immediately upon it, as shown in FIG. 2a. The purpose of the planarisation and transfer layer is twofold. It acts to provide a surface parallel to that of the template, which is important to ensure that the contact between the template and the resin is parallel, and also to improve the embodiment ratio of the printed features, as will be described below.

After the template has been removed, a residual layer 22 of the solidified resin is left on the planarisation and transfer layer, shaped in the desired pattern. The first etch is isotropic and removes parts of the residual layer, resulting in a poor embodiment ratio of features where L1 is the height of the features 23, as shown in FIG. 2b. The second etch is anisotropic (or selective) and improves the embodiment ratio. The anisotropic etch removes those parts of the planarisation and transfer layer which are not covered by the solidified resin, increasing the embodiment ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only is the pattern transfer be performed at a higher temperature, but also relatively large temperature differentials might be required in order to ensure the resin is adequately solidified before the template is removed. Temperature differentials between 35 and 100° C. are known from literature. Differential thermal expansion between for instance the substrate and template can then lead to distortion in the transferred pattern. The problem is exacerbated by the relatively high pressures used for the imprinting, due the viscous nature of the imprintable materials, which can induce mechanical deformation in the substrate, again distorting the pattern.

UV imprint lithography on the other hand does not involve such high temperatures and temperature changes. Nor does it require such viscous imprintable materials. Rather UV imprint lithography involves the use of a transparent template and a UV-curable liquid, typically a monomer such as an acrylate or methacrylate for example. Further information may be found in J. Haisma "Mold-assisted nanolithography: A process for reliable pattern replication", J. Vac. Sci. Technol. B 14(6), November/December 1996). In general any photopolymerisable material could be used, such as a mixture of monomers and an initiator. The curable liquid may also for instance include a dimethyl siloxane derivative. Such materials are much less viscous than the thermosetting and thermoplastic resins used in hot imprint lithography and consequently move much faster to fill template pattern features. Low temperature and low pressure operation also favours higher throughput capabilities. Although the name 'UV imprint lithography' implies that UV light is always used, it should be appreciated that any suitable actinic radiation may be used (for example visible light may be used). Hence, any reference in this document to UV imprint lithography, UV light, or UV curable materials, etc should be interpreted as including any suitable actinic radiation, and should not be interpreted as being limited to UV light only.

An example of a UV imprint process is illustrated in FIG. 1c. A quartz template 16 is applied to a UV-curable resin 17 in a similar manner to the process of FIG. 1b. Instead of raising the temperature as in hot embossing employing thermosetting resins, or temperature cycling when using thermoplastic resins, UV light is applied to the resin through the quartz template in order to polymerise and thus cure it. Upon removal of the template, the remaining steps of etching the residual layer of resist are the same as for the hot embossing process described above. The UV curable resins typically used have a much lower viscosity than typical thermoplastic resins so that lower imprint pressures are used. Reduced physical deformation due to the lower pressures, together with reduced deformation due to high temperatures and temperature changes, makes UV imprint lithography better suited to application requiring high overlay accuracy. In addition the transparent nature of UV imprint templates can accommodate optical alignment techniques simultaneously to the imprint.

Although this type of imprint lithography mainly uses UV curable materials, and is thus generically referred to as UV imprint lithography, other wavelengths of light may be used to cure appropriately selected materials (e.g. activate a polymerisation or cross linking reaction). In general any radiation capable of initiating such a chemical reaction may be used if an appropriate imprintable material is available. Alternative "activating light" may for instance include visible light, infra-red light, x-ray radiation and electron beam radiation. In the general description above, and below, references to UV imprint lithography and use of UV light are not intended to exclude these and other activating light possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to roller templates.

There is a particular development of UV imprint technology known as step and flash imprint lithography (SFIL) which may be used to pattern a substrate in small steps in a similar manner to optical steppers conventionally used in IC manufacture (U.S. Patent Application Publication 2004/0124566 A1 describes in detail a an example of a step and flash imprint lithography apparatus). This involves printing small areas of the substrate at a time by imprinting a template into a UV curable resin, 'flashing' UV light through the template to cure the resin beneath the template, removing the template, stepping to an adjacent region of the substrate and repeating the operation. The small field size of such step and repeat processes minimises pattern distortions CD variations so that SFIL is particularly suited to manufacture of IC and other devices requiring high overlay accuracy.

Although in principle the UV curable resin can be applied to the entire substrate surface, for instance by spin coating, this is problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a certain volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features whilst at the same time minimizing excess resin which can be rolled to an undesirably thick or uneven residual layer since as soon as neighbouring drops touch fluid the resin will have nowhere to flow. The problems associated with overly thick or uneven residual layer are discussed below.

Figure 3:
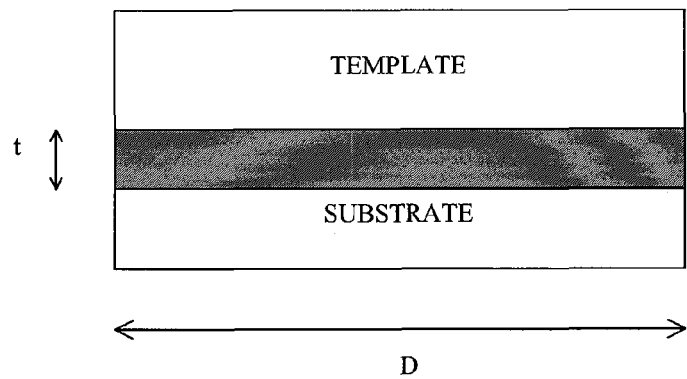
FIG. 3 schematically illustrates a template and a typical imprintable resist layer deposited on a substrate.

FIG. 3 illustrates the relative dimensions of the template, imprintable material (curable monomer, thermosetting resin, thermoplastic etc) and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer left after stamping is useful in protecting the underlying substrate, but as mentioned above it is also the source of a number of problems particularly when high resolution and/or overlay accuracy is desired. The first 'breakthrough' etch is isotropic (non-selective) and will thus to some extent erode the features imprinted as well as the residual layer. This is exacerbated if the residual layer is overly thick and/or uneven.

This problem can for instance lead to variation in the thickness of lines ultimately formed in the underlying substrate (i.e. variation in the critical dimension). The uniformity of the thickness of a line that is etched in the transfer layer in the second anisotropic etch is dependant upon the embodiment ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process.

In principle the above problem can be reduced by ensuring the residual layer is as thin as possible but this can require application of undesirably large pressures (increasing substrate deformation) and relatively long imprinting times (reducing throughput).

The template is a significant component of the imprint lithography system. As noted above, the resolution of the features on the template surface is a limiting factor on the attainable resolution of features printed on the substrate. The templates used for hot and UV lithography are generally formed in a two-stage process. Initially, the desired pattern is written using, for example, electron beam writing, to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally a technique capable of very high resolution will be preferred as the template is effectively a 1× mask with the resolution of the transferred pattern being limited by the resolution of the pattern on the template.

The release characteristics of the template may also be an important consideration. The template may for instance be treated with a surface treatment material to form a thin release layer on the template having a low surface energy (a thin release layer may also be deposited on the substrate).

Although reference is made above to depositing UV curable liquids onto a substrate, the liquids could also be deposited on the template and in general the same techniques and considerations will apply.

Another important consideration in the development of imprint lithography is the mechanical durability of the template. The template is subjected to large forces during stamping of the resist, and in the case of hot lithography, it is also subjected to extremes of pressure and temperature. This will cause wearing of the template, and may adversely affect the shape of the pattern imprinted upon the substrate.

In hot imprint lithography there are potential advantages in using a template of the same or similar material to the substrate to be patterned in order to minimise differential thermal expansion between the two. In UV imprint lithography the template is at least partially transparent to the activation light and accordingly quartz templates are used. Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

While in the description above particular reference has been made to the use of imprint lithography to transfer a template pattern to a substrate via an imprintable resin effectively acting as a resist, in some circumstances the imprintable material may itself be a functional material, for instance having a functionally such as conductivity, optical linear or non linear response amongst others. For example the functional material may form a conductive layer, a semiconductive layer, a dielectric layer or a layer having another desirable mechanical, electrical or optical property. Some organic substances may also be appropriate functional materials. Such applications may be within the scope of an embodiment of the present invention.

Figure 4:
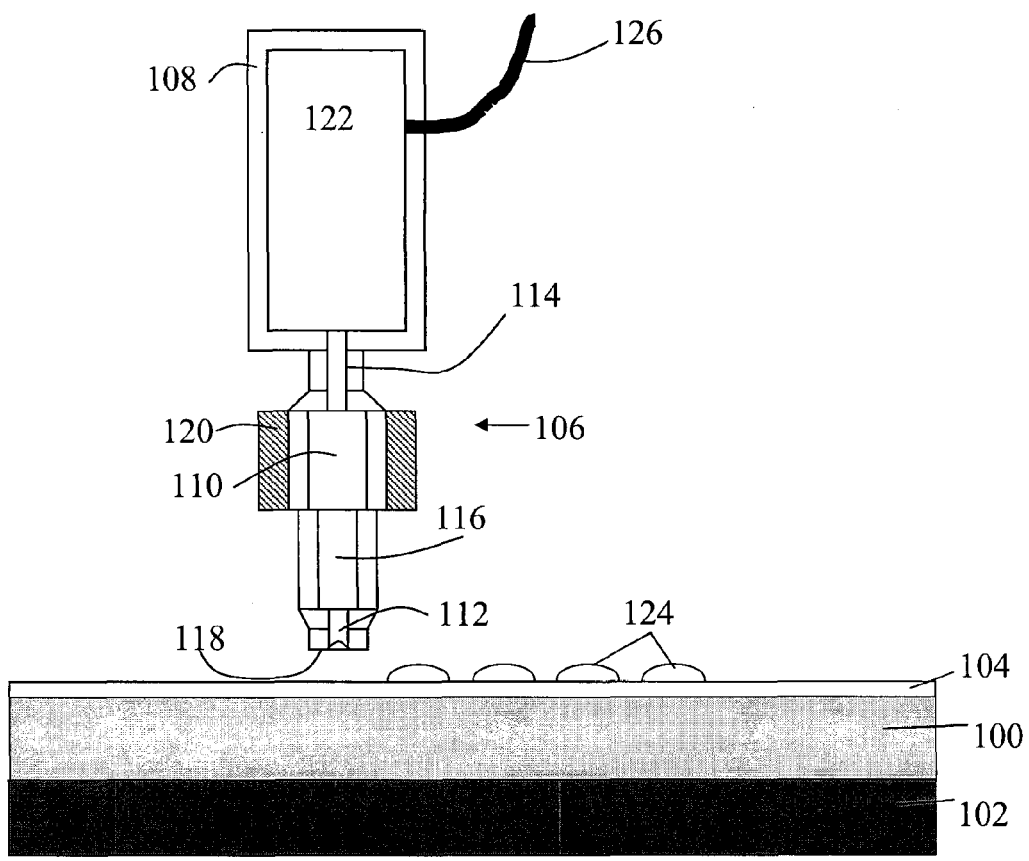
FIGS. 4 and 5 illustrate an imprintable medium dispenser which embodies the invention.

FIG. 4 shows schematically in cross section part of a substrate 100 which is supported by a substrate table 102. A planarisation layer 104 comprising for example poly(methyl methacrylate) or polystyrene is provided on an upper surface of the substrate.

An imprintable medium dispenser 106 is located above the substrate 100. The imprintable medium dispenser comprises a reservoir 108 connected to a pump chamber 110, which is in turn connected to a nozzle 112. The reservoir 108 is connected to the pump chamber 110 by a first connecting tube 114. The pump chamber 110 is connected to the nozzle 112 via a second connecting tube 116. A lowermost end of the nozzle 112 is surrounded by a flat region which will be referred to as a nozzle plate 118. The pump chamber 110 is surrounded by a ring-shaped piezo-electric actuator 120. The manner in which the piezo-electric actuator 120 is controlled is described further below.

The diameter of the first connecting tube 114 is significantly less than the diameter of the second connecting tube 116, and both diameters are less than the diameter of the pump chamber 110. Typically the length of an imprintable medium dispenser is 10 to 30 mm. Nozzle 112 diameters range from 20-60 μm. The diameters of the pump chamber 110 and the connecting tube 116 are 100-200 μm. The length of the nozzle 112 is about equal to the diameter of the nozzle. Smaller nozzles deliver smaller droplets compared to the droplets ejected from a nozzle with a large diameter. To generate a small droplet all interior dimensions of the imprintable medium dispenser are small. The first connecting tube 114 (which may be referred to as a fluidic restriction) is dimensioned such that most of the volume displacement of the actuator is used to generate a droplet.

In use, the pump chamber 110, connecting tubes 114, 116 and nozzle 112 are filled with imprintable medium 122 from the reservoir 108. The substrate table 102 and substrate 100 are positioned below the nozzle 112 by moving the substrate table. An impulse is applied to the piezo-electric actuator 120, causing a pressure wave to travel through the imprintable medium 122. The pressure wave travels downwards through the second connecting tube 116 into the nozzle 112 and causes a droplet of imprintable medium 122 to be ejected from the nozzle onto the substrate 100. Previously ejected droplets of imprintable medium 124 are shown on the substrate 100. The restricted diameter of the first connecting tube 114 inhibits the pressure wave from traveling upwards into the reservoir 108. Imprintable medium 122 is drawn downwards into the pump chamber 110 mainly by surface tension forces in the nozzle, to replace the imprintable medium that was ejected onto the substrate 100.

The imprintable medium dispenser 106 may be one of a plurality configured in an array. The array may be used to deposit an array of droplets of imprintable medium 124 on the substrate 100. The nozzle plate 118 may comprise a single plate which is provided with an array of nozzles, each nozzle being connected to a different pump chamber 110. Where this is done, each pump chamber is usually individually controlled by its own piezo-electric actuator.

The array may be used to provide droplets of imprintable medium 124 over the entire surface of a substrate 100, or over one or more regions of the substrate. An imprint template may then be used to imprint a pattern into the imprintable medium 124, for example as described further above in relation to FIG. 1c.

Although the piezo-electric actuator 120 described above is provided in a ring around the pump chamber 110, the piezo-actuator may have some other form. For example, a piezo-electric actuator may be provided on one side of the pump chamber 110. Any configuration of piezo-electric actuator and pump chamber which allows a pressure wave to be generated in the imprintable medium may be used. It may be possible to provide the piezo-electric actuator 120 at some other location, for example on the nozzle 112 or nozzle plate 118.

Figure 5A:
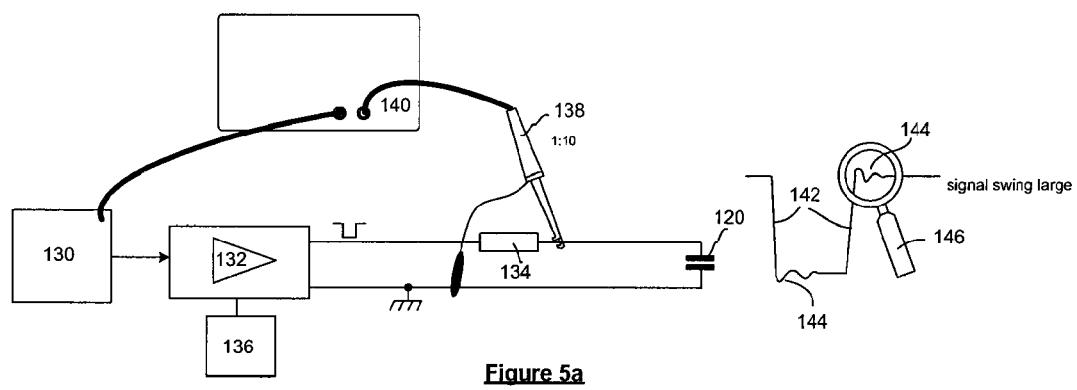

A control circuit for controlling the operation of the piezo-electric actuator 120 is shown in FIG. 5a. The control circuit comprises a controller 130, which is connected via a pulse amplifier 132 and a resistor 134 to the piezo-electric actuator 120. The pulse amplifier 132 is connected to a voltage source 136. The pulse amplifier may be configured to amplify a signal from the controller 130 up to 50-200V, i.e. sufficient to operate the piezo-electric actuator 120 (the piezo-electric actuator may be of the low-voltage type). A voltage probe 138 is connected between the resistor 134 and the piezo-electric actuator 120. The voltage probe 138 is also grounded in the conventional manner. A computer 140 is connected to the voltage probe 138. This may be via for example a suitable analogue to digital converter. The analogue to digital converter may be a NI-PCI 5112 high-speed 8-bit digitizer. The computer is also connected to the controller 130, and may for example instruct the controller to start or stop operation of the controller.

In use, the controller 130 is configured to periodically generate impulses which pass via the pulse amplifier 132 and the resistor 134 to the piezo-electric actuator 120. The piezo electric actuator 120 is actuated periodically by the impulses, thereby sending pressure impulses into the imprintable medium 122 (see FIG. 4), such that the imprintable medium is deposited onto the substrate 100.

Upon actuation, the piezo-electric actuator 120 and its surroundings start to oscillate. The oscillations in the imprintable medium 122 surrounded by the piezo-electric actuator 120 are pressure waves. The piezo-electric actuator senses these oscillations and pressure waves. The voltage probe 138 passes to the computer 140 the oscillating voltage signal associated with the mechanical oscillations and pressure waves generated after actuation of the piezo-electric actuator 120. An example of such a signal is shown to the right hand side of FIG. 5*a*. The signal includes transitions 142 between high and low states, and in addition includes transient oscillations 144. The transient oscillations 144 are small in size compared with the transitions 142. Their size is exaggerated in FIG. 5*a* for ease of illustration, and this is illustrated schematically by a magnifying glass 146. The amplitude and frequency components of the transient oscillations 144 are determined by the pump chamber 110, nozzle 112 and other parts of the imprintable medium dispenser 106. Therefore, if a property of the pump chamber 110, nozzle 112 (or the imprintable medium 122) changes, this may be apparent to the computer 140 from the transient oscillations 144, as will be described further below.

Figure 5B:
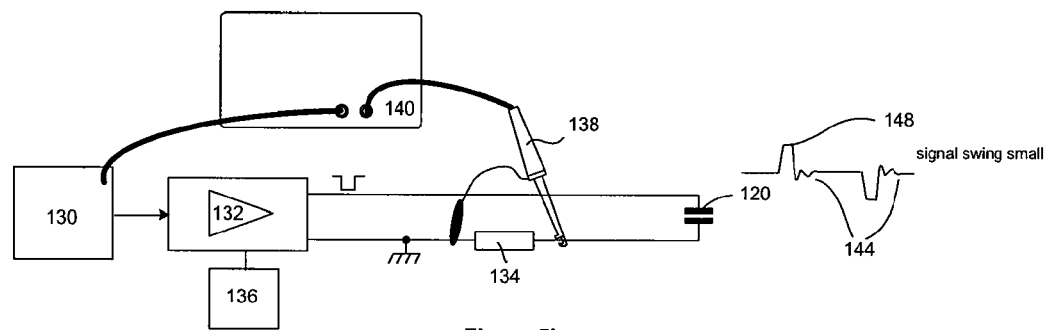

A modified control circuit for controlling the operation of the piezo-electric actuator 120 is shown in FIG. 5*b*. The control circuit shown in FIG. 5*b* corresponds in large part to that shown in FIG. 5*a*. Corresponding components are given the same reference numerals. In the control circuit of FIG. 5*b*, the resistor 134 is connected between the piezo-electric actuator 120 and ground, and the voltage probe 138 is connected between the resistor 134 and the piezo-electric actuator 120. When the voltage probe 138 is connected in this manner, the transitions seen in FIG. 5*a* are removed from the signal that is passed to the computer 140. This allows the transient oscillations 144 to be more easily monitored. The signal may include peaks and troughs 148 caused by current flow during the transitions, but the size of these peaks and troughs is significantly less than the transitions seen when using the arrangement of FIG. 5*a*.

The computer 140 may be configured to monitor changes in the transient oscillations 144 by for example storing a transient oscillations which are seen when the imprintable medium dispenser 106 is functioning correctly, and then comparing them with subsequently measured transient oscillations.

One example of a change in the state of the imprintable medium dispenser 106 which may be seen by monitoring the transient oscillations 144 is the build up of a bubble within the pump chamber 110. In a typical bubble formation scenario a very small bubble, maybe nanometers in diameter, appears. The bubble gradually grows in size over a period of time. When the bubble initially forms, it may be that the bubble has only a minor effect on the ejection of imprintable medium 122 onto the substrate 104. An ejected droplet 124 may for example be slightly smaller than would normally be the case, but may be large enough for the requirements of the imprint process (i.e. within a pre-determined tolerance). As the bubble grows in size (due to rectified diffusion), at a given moment in time, the bubble will be sufficiently large that it causes the ejected droplet of imprintable medium 122 to fall outside of the tolerance limit. By monitoring the transient oscillations 144 the computer 140 is able to monitor the growth of the bubble. The computer may allow the bubble to grow provided that it is not causing the imprintable medium dispenser 106 to dispense droplets of imprintable medium 124 which fall outside of the tolerance limit. The computer may then interrupt operation of the controller 130, so that the transmission of impulses to the piezo-electric actuator 120 is interrupted. The bubble may then be removed, before allowing depositing of imprintable medium 122 to continue.

The bubble may be removed from the pump chamber 110 by for example flushing the imprintable medium dispenser 106 with imprintable medium 122. This may be done for example by moving the substrate table 102 away from the imprintable medium dispenser 106, then forcing imprintable medium 122 to flow through the imprintable medium dispenser 106. A suitable receptacle (not shown) may be located beneath the imprintable medium dispenser 106 to catch imprintable medium 122 ejected from the nozzle 112 during this procedure.

The same monitoring procedure may be used to monitor the formation of bubbles at other locations in the imprintable medium dispenser 106, for example in the nozzle 112.

Changes in the viscosity of the imprintable medium 122 may be monitored using the transient oscillations 144. The imprintable medium 122 may become thicker, for example due to evaporation or gelation. This may be caused for example by heat, time or exposure to UV radiation. The computer 140 may monitor this change, and may interrupt operation of the imprintable medium dispenser 106 when this is observed. In some instances, the computer 140 may delay the interruption if the change in viscosity does not cause the droplets of imprintable medium 124 to fall outside of predetermined tolerances.

Monitoring the transient oscillations 144 may be used to determine if the under-pressure of the imprintable medium has changed. Referring to FIG. 4, the imprintable medium 122 is held in the reservoir 108 at a pressure which is below atmospheric pressure. Surface tension, together with this under-pressure, causes the surface of the imprintable medium 122 in the nozzle 112 to curve upwardly. This curvature can be seen in FIG. 4. Increasing the under-pressure (i.e. reducing the pressure of the imprintable medium 122) will cause the curvature to increase, and reducing the under-pressure will cause the curvature to reduce. The under-pressure is controlled by a connection 126 between the reservoir 108 and a pressure controller (not shown). The under-pressure has an effect on the size of the droplets 124 of imprintable medium that are ejected onto the substrate 100. The computer 140 may monitor the under-pressure via the transient oscillations, and interrupt ejection of imprintable medium 122 if a change of the under-pressure is seen which would cause the droplets of imprintable medium 124 to fall outside of the predetermined tolerance.

If for some reason the under-pressure were to be lost, and the imprintable medium 122 were to be held at atmospheric pressure, or above atmospheric pressure, then the surface of the imprintable medium would no longer curve upwardly into the nozzle 112. Instead, the imprintable medium 122 may bow outwardly from the nozzle 112. The imprintable medium 122 may then spread onto the nozzle plate 118. Where this occurs it will have a significant impact on the size of the droplets of imprintable medium 124, and may also affect the positions at which the droplets are formed on the substrate 100. In general, the droplets pass directly downwards from the nozzle 112 onto the substrate 100. However, contamination of the nozzle plate 118 may cause the droplets to be translated sideways. Thus, even if the droplets were of the correct size, the resulting array of droplets on the substrate 100 would be incorrect.

Where contamination of the nozzle plate 118 is detected by the computer 140, ejection of the imprintable medium is interrupted until the contamination has been removed. The nozzle plate 118 is anti-wetting in order to inhibit the spread of imprintable medium 122 onto the nozzle plate. Once imprintable medium has spread onto the nozzle plate, this may affect the anti-wetting properties of the nozzle plate 118. For this reason, if contamination of the nozzle plate 118 has occurred, adjusting the pressure of the imprintable medium 122 so that it is once again correctly under-pressured may not be sufficient. The nozzle plate 118 may also need to be cleaned. This may be done for example by moving the substrate table 102 away from the imprintable medium dispenser 106, and moving a suitable cleaning apparatus to beneath the imprintable medium dispenser. The cleaning apparatus may clean the nozzle plate 118 and the return to its original position. The substrate table 102 may then be returned to beneath the imprintable medium dispenser 106.

If the pump chamber 110 were to begin to empty of imprintable medium 122, then this would be apparent in the transient oscillations 144. The computer 140 may arrange for the pump chamber 110 to be replenished accordingly. The pump chamber 110 may be replenished before the depletion of the imprintable medium 122 causes droplets of imprintable medium 124 to be formed which fall outside of the predetermined tolerance.

The nozzle 112 may for example be formed from glass or metal. Where the nozzle is formed from metal, it may comprise a plate provided with an array of holes. Each nozzle is connected to a separate pump chamber which is separately controlled using a piezo-electric actuator.

At least to some extent the properties of the imprintable medium dispenser 106 will not vary from dispenser to dispenser. For this reason, where arrays of dispensers are manufactured, it may be possible to use the same software to monitor the operation of each of the imprintable medium dispensers of the array. It may be possible to determine a specific problem at an imprintable medium dispenser based upon the particular property which has fallen outside of the predetermined limit. The software may therefore be configured to monitor specific properties of the transient oscillations 144, and take appropriate remedial action when those properties fall outside of predetermined limits. Alternatively, the software may be configured such that ejection of imprintable medium is interrupted whenever any property of the transient oscillations 144 falls outside of the predetermined tolerance, with the same remedial action being performed each time (or subsequent diagnosis and remedial action being performed separately).

The software may be configured to store transient oscillations 144 seen during normal operation of the imprintable medium dispenser 106, for comparison with subsequent transient oscillations. Alternatively, the software may be provided with standard transient oscillations 144 which are expected to be seen during operation of the imprintable medium dispenser 106. In general, a standard imprintable medium is used for imprint lithography, and so it may not be necessary to adjust the transient oscillations 144 in the software to take account of the imprintable medium itself. However, if some other fluid were to be used (for example an imprintable medium having a different viscosity), then different standard transient oscillations would be required. These may be stored in the software.

FIG. 6 shows in the frequency and time domain transient oscillations detected during operation of an imprintable medium dispenser. The grey lines indicate the signal detected during correct operation of the imprintable medium dispenser, and the white lines indicate the signal detected when the reservoir 122 and connecting channel 114 of the imprintable medium dispenser were almost empty. In the time domain it can be seen that there are significant differences between the grey line and the white line. Software controlling the imprintable medium dispenser may be configured to interrupt operation of the imprintable medium dispenser when differences of this magnitude are seen, or when the specific wave form (or similar) is seen.

In addition, or as an alternative, to monitoring in the time domain, the transient oscillations may be monitored in the frequency domain. A Fourier transform may for example be used to convert the signal from the time domain to the frequency domain. Referring to the lower part of FIG. 6, during normal operation a series of frequency peaks are seen in the monitored signal. When the pump chamber 110 is nearly empty, in the frequency domain signal the lowermost two frequency peaks are suppressed. The software may be configured such that when these frequency peaks are suppressed appropriate remedial action is taken, for example refilling with imprintable medium.

Referring to FIG. 7, the Helmholtz frequency (also referred to as key tone) of the monitored transient oscillations is illustrated as a function of the pressure of the imprintable medium. The Helmholtz frequency (or key tone) is the lowermost frequency at which a peak is seen in the transient oscillations. Referring to FIG. 7, it can be seen that as the pressure of the imprintable medium is increased, the Helmholtz frequency decreases. A marked step downwards of the frequency is seen when the pressure of the imprintable medium transitions from below atmospheric pressure to above atmospheric pressure (i.e. when the pressure goes from being under-pressure to over-pressure). The drop in Helmholtz frequency is due to the imprintable medium spreading over the nozzle plate 118. FIG. 7 demonstrates how the under-pressure can be monitored in a straightforward manner by the computer 140.

Figure 8:
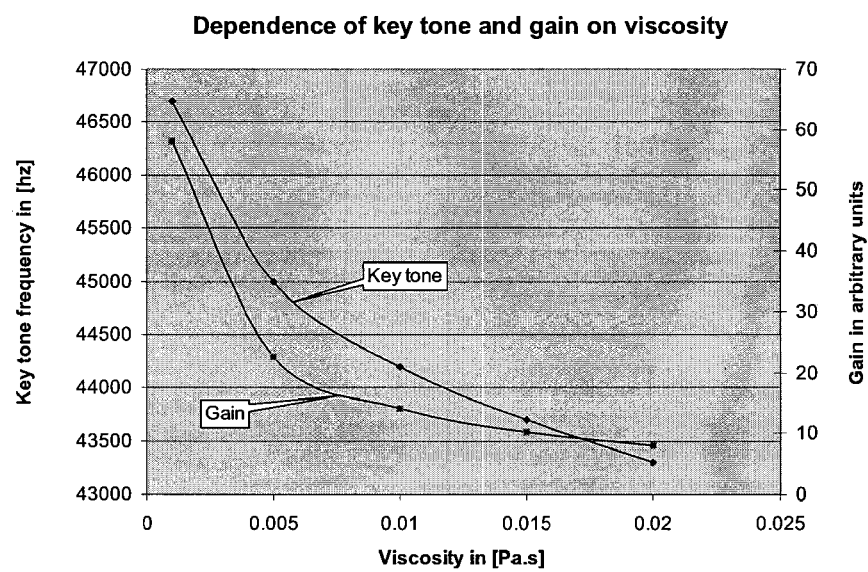
FIG. 8 shows a graphical representation of an effect of viscosity data on the Helmholtz frequency data detected during operation of the embodiment(s) of the invention.

FIG. 8 shows the effect of viscosity of the imprintable medium on the Helmholtz frequency (the equivalent term "key tone" is used in FIG. 8). FIG. 8 also shows the pressure gain as a function of the viscosity of the imprintable medium. It can be seen from FIG. 8 that the Helmholtz frequency is quite closely related to the pressure gain, and so monitoring the Helmholtz frequency will give an indication of the pressure gain.

The invention allows future failure of an imprintable medium dispenser to be predicted, as described above. In addition, the invention allows the prediction of when droplets of imprintable medium will be dispensed which do not fall within predetermined tolerances, so that ejection of imprintable medium can be interrupted before this occurs.

In the event that the imprintable medium dispenser fails, or droplets of imprintable medium are dispensed which fall outside of the predetermined tolerances, the locations of defective target regions on the substrate may be recorded. These target areas may then be omitted during imprinting of future layers. Alternatively, imprinting of the target areas may be repeated such that correctly imprinted patterns are provided in those target regions. The imprintable medium dispenser may be refilled/cleaned/maintained such that it functions correctly once more.

In an alternative arrangement, if it is determined that particular droplets of imprintable medium have been omitted or are too small, the imprintable medium dispenser may be refilled/cleaned/maintained and then used to replace the omitted imprintable medium or replenish it. It may be desired to do this quickly, so that evaporation of droplets of imprintable medium from the substrate is minimized.

Two arrays of imprint nozzles may be provided adjacent to one another, both being configured to deposit imprintable medium onto the substrate. If one or more of the nozzles in one array fails, or is predicted to fail, then it may be switched off, with the other array then being actuated twice as fast. In this way, ejection of droplets of imprintable medium onto the substrate continues at the same speed. The defective imprintable medium dispenser may be refilled/cleaned/maintained, for example whilst ejection of the imprintable medium from the other array of nozzles is performed. As an alternative to increasing the speed of operation of the remaining array of imprint nozzles, the speed of movement of the substrate with respect to the array of imprint nozzles may be reduced.

In some instances it may be desired to store all of the transient oscillations for future reference. These may be used for example to check later whether all droplets of imprintable medium have been correctly ejected.

In some instances, the manner in which an imprintable medium dispenser is operated may be modified, based on information determined from the transient oscillations. For example, if cavitation of the imprintable medium were to occur (i.e. The formation and instantaneous collapse voids or cavities), the controller 130 may be adjusted so that droplets of imprintable medium are ejected at a lower frequency. This may help to suppress the cavitation. The same adjustment may be applied if the transient oscillations indicate that the viscosity of the imprintable medium is too high (or that damping is poor). It may be possible to correct incomplete refilling of the reservoir 108 and/or pump chamber 110 by adjusting the under-pressure to a lower value.

The control circuit described further above uses a piezo-electric control signal to monitor transient oscillations indicating properties of the imprintable medium dispenser. However, other apparatus may be used to monitor the transient oscillations. The transient oscillations are present in the walls of the pump chamber 110, and this is why they are picked up by the piezo-eclectic actuator. A microphone could be attached to a wall of the pump chamber 110, or some other impedance monitoring or capacitance monitoring device. In general, any detector which detects vibration of the pump chamber wall may be used. It is not necessary that the microphone or other monitoring device be attached to the pump chamber 110. It could instead be attached to any other location on the imprintable medium dispenser 106 which vibrates during operation (for example on the nozzle 112, nozzle plate 118, or connecting tube 116). In some cases, a piezo-electric actuator may be provided in two parts, a first part being used for actuation and a second part being used for sensing.

In an embodiment, there is provided an imprintable medium dispenser, comprising: a chamber; a nozzle; an actuator connected to the chamber and configured to be actuated and thereby generate a pressure wave within the chamber such that imprintable medium is dispensed from the nozzle; and a control circuit including a monitoring apparatus configured to receive a transient oscillation signal generated when the actuator is actuated and to monitor the operation of the imprintable medium dispenser by monitoring the transient oscillation signal.

In an embodiment, the actuator is a piezo-electric actuator. In an embodiment, the piezo-electric actuator encircles the chamber. In an embodiment, the actuator provides the transient oscillation signal. In an embodiment, the control circuit further comprises a detector configured to detect transient oscillations of the imprintable medium dispenser and to provide the transient oscillation signal. In an embodiment, the dispenser further comprises a memory configured to store a transient oscillation signal for comparison with a received transient oscillation signal. In an embodiment, the monitoring apparatus comprises a computer configured to compare the stored transient oscillation signal with the received transient oscillation signal and to initiate remedial action if the received transient oscillation signal deviates from the stored transient oscillation signal by more than a predetermined amount. In an embodiment, the remedial action comprises stopping dispensing of the imprintable medium from the nozzle. In an embodiment, the monitoring apparatus is configured to monitor formation of a bubble in the imprintable medium, changes of viscosity of the imprintable medium, under-pressure of the imprintable medium, emptying of imprintable medium from the dispenser, cavitation of the imprintable medium, and/or contamination of a nozzle plate of the dispenser with imprintable medium.

In an embodiment, there is provided an array of dispensers configured to dispense an array of droplets of imprintable medium onto a substrate, each dispenser comprising: a chamber; a nozzle; an actuator connected to the chamber and configured to be actuated and thereby generate a pressure wave within the chamber such that imprintable medium is dispensed from the nozzle; and a control circuit including a monitoring apparatus configured to receive a transient oscillation signal generated when the actuator is actuated and to monitor the operation of the imprintable medium dispenser by monitoring the transient oscillation signal.

In an embodiment, each dispenser of the array of dispenser is provided with an independently controllable actuator.

In an embodiment, there is provided a imprint lithography apparatus, comprising: an imprintable medium dispenser, the imprintable medium dispenser comprising a chamber; a nozzle; an actuator connected to the chamber and configured to be actuated and thereby generate a pressure wave within the chamber such that imprintable medium is dispensed from the nozzle; and a control circuit including a monitoring apparatus configured to receive a transient oscillation signal generated when the actuator is actuated and to monitor the operation of the imprintable medium dispenser by monitoring the transient oscillation signal.

In an embodiment, there is provided a method of dispensing imprintable medium from a dispenser comprising a chamber, a nozzle, and an actuator connected to the chamber, the method comprising: actuating the actuator such that it generates a pressure wave within the chamber which causes imprintable medium to be dispensed from the nozzle; and monitoring operation of the dispenser by monitoring a transient oscillation signal generated when the actuator is actuated.

In an embodiment, monitoring comprises monitoring formation of a condition including a bubble in the imprintable medium, changes of viscosity of the imprintable medium, incorrect under-pressure of the imprintable medium, emptying of imprintable medium from the dispenser, cavitation of the imprintable medium, and/or contamination of a nozzle plate of the dispenser with imprintable medium. In an embodiment, the method further comprises performing remedial action to correct the condition once it has been detected. In an embodiment, the method further comprises comparing the generated transient oscillation signal with a stored transient oscillation signal. In an embodiment, the method further comprises stopping dispensing of imprintable medium if a property of the generated transient oscillation signal differs from the stored transient oscillation signal by more than a predetermined amount. In an embodiment, the property is the Helmholtz frequency of the transient oscillation signals. In an embodiment, the dispenser is one of an array of dispensers, the method further comprising using the array of dispensers to dispense an array of droplets of imprintable medium onto a substrate. In an embodiment, each dispenser of the array of dispenser is independently actuated.

While specific examples of the invention have been described above, it will be appreciated that the present invention may be practiced otherwise than as described. The description is not intended to limit the invention.

What is claimed is:

1. A method of dispensing imprintable medium from a dispenser comprising a chamber, a nozzle, and an actuator connected to the chamber, the method comprising:

actuating the actuator such that it generates a pressure wave within the chamber which causes imprintable medium to be dispensed from the nozzle; and monitoring operation of the dispenser by monitoring a transient oscillation signal generated when the actuator is actuated, the monitoring further comprising comparing values associated with a plurality of parts of a waveform of a reference transient oscillation signal with values associated with a plurality of parts of a waveform of the monitored transient oscillation signal, and notifying of an error in the operation of the dispenser if there is a variation between one or more values associated with the plurality of parts of the waveform of the monitored transient oscillation signal and one or more values associated with the plurality of parts of the waveform of the reference transient oscillation signal.

2. The method of claim 1, wherein monitoring comprises monitoring formation of a condition including a bubble in the imprintable medium, changes of viscosity of the imprintable medium, incorrect under-pressure of the imprintable medium, emptying of imprintable medium from the dispenser, cavitation of the imprintable medium, and/or contamination of a nozzle plate of the dispenser with imprintable medium.

3. The method of claim 2, further comprising performing remedial action to correct the condition once it has been detected.

4. The method of claim 2, further comprising comparing the generated transient oscillation signal with a stored transient oscillation signal.

5. The method of claim 4, further comprising stopping dispensing of imprintable medium if a property of the generated transient oscillation signal differs from the stored transient oscillation signal by more than a predetermined amount.

6. The method of claim 5, wherein the property is the Helmholtz frequency of the transient oscillation signals.

7. The method of claim 1, wherein the dispenser is one of an array of dispensers, the method further comprising using the array of dispensers to dispense an array of droplets of imprintable medium onto a substrate.

8. The method of claim 7, wherein each dispenser of the array of dispenser is independently actuated.

9. A method of dispensing imprintable medium from a dispenser comprising a chamber, a nozzle, and an actuator connected to the chamber, the method comprising:

actuating the actuator such that it generates a pressure wave within the chamber which causes imprintable medium to be dispensed from the nozzle; and monitoring operation of the dispenser by monitoring a transient oscillation signal generated when the actuator is actuated, the monitoring further comprising comparing a plurality of parts of a waveform of a stored, transient oscillation signal with a plurality of parts of a waveform of the monitored transient oscillation signal, and initiating remedial action if one or more of the plurality of parts of the waveform of the monitored transient oscillation signal deviates from one or more of the plurality of parts of the waveform of the stored transient oscillation signal by more than a certain amount.

10. The method of claim 9, wherein the actuator is a piezo-electric actuator.

11. The method of claim 10, wherein the piezo-electric actuator encircles the chamber.

12. The method of claim 9, wherein the actuator provides the transient oscillation signal.

13. The method of claim 9, further comprising detecting transient oscillations of the imprintable medium dispenser to provide the transient oscillation signal.

14. The method of claim 9, comprising monitoring for formation of a bubble in the imprintable medium, a change of viscosity of the imprintable medium, an under-pressure of the imprintable medium, emptying of imprintable medium from the dispenser, cavitation of the imprintable medium, and/or contamination of a nozzle plate of the dispenser with imprintable medium.

15. The method of claim 9, wherein the remedial action comprises stopping dispensing of the imprintable medium from the nozzle.

16. A method of dispensing imprintable medium from a dispenser comprising a chamber, a nozzle, and an actuator connected to the chamber, the method comprising:

actuating the actuator such that it generates a pressure wave within the chamber which causes imprintable medium to be dispensed from the nozzle; and monitoring operation of the dispenser by monitoring a transient oscillation signal generated when the actuator is actuated, wherein the monitoring is based on a Helmholtz frequency or key tone of the transient oscillation signal.

17. The method of claim 16, wherein the actuator provides the transient oscillation signal.

18. The method of claim 16, wherein the actuator is a piezo-electric actuator.

19. The method of claim 16, further comprising comparing the transient oscillation signal with a stored transient oscillation signal.

20. The method of claim 16, comprising monitoring for formation of a bubble in the imprintable medium, a change of viscosity of the imprintable medium, an under-pressure of the imprintable medium, emptying of imprintable medium from the dispenser, cavitation of the imprintable medium, and/or contamination of a nozzle plate of the dispenser with imprintable medium, based on the transient oscillation signal.

* * * * *